(12) United States Patent
Inokuchi et al.

(10) Patent No.: US 9,112,139 B2
(45) Date of Patent: Aug. 18, 2015

(54) SPIN TRANSISTOR AND MEMORY

(75) Inventors: Tomoaki Inokuchi, Yokohama (JP);
Takao Marukame, Tokyo (JP);
Tetsufumi Tanamoto, Kawasaki (JP);
Hideyuki Sugiyama, Kawasaki (JP);
Mizue Ishikawa, Yokohama (JP);
Yoshiaki Saito, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/526,007

(22) Filed: Jun. 18, 2012

(65) Prior Publication Data
US 2013/0075843 A1    Mar. 28, 2013

(30) Foreign Application Priority Data

Sep. 26, 2011    (JP) .................. 2011-209915

(51) Int. Cl.
*H01L 43/08*    (2006.01)
*H01L 29/66*    (2006.01)

(52) U.S. Cl.
CPC ........... *H01L 43/08* (2013.01); *H01L 29/66984* (2013.01)

(58) Field of Classification Search
CPC .............. H01L 29/66984; H01L 29/73; H01L 29/78642; H01L 43/08
USPC .................................. 257/421, E21.41, 295
See application file for complete search history.

(56) References Cited

U.S. PATENT DOCUMENTS 7,629,658 B2    12/2009  Sugiyama et al.
7,825,485 B2    11/2010  Sugahara et al.
7,851,877 B2    12/2010  Tanaka et al.
7,973,375 B2    7/2011   Koga
2004/0061156 A1*  4/2004  Cha .................. 257/295
2006/0043443 A1    3/2006   Sugahara et al.

(Continued)

FOREIGN PATENT DOCUMENTS

JP    2004-111904    4/2004
JP    2008-226901    9/2008

(Continued)

OTHER PUBLICATIONS

Satoshi Sugahara et al., "A spin metal-oxide-semiconductor field-effect transistor (spin MOSFET) with a ferromagnetic semiconductor for the channel", Journal of Applied Physics, 2005, vol. 97, No. 10D503, pp. 10D503-1-10D503-3.

(Continued)

*Primary Examiner* — Eugene Lee
*Assistant Examiner* — Fang-Xing Jiang
(74) *Attorney, Agent, or Firm* — Oblon, McClelland, Maier & Neustadt, L.L.P.

(57) ABSTRACT

A spin transistor according to an embodiment includes: a first magnetic layer formed above a substrate and serving as one of a source and a drain; an insulating film having a lower face facing to an upper face of the first magnetic layer, an upper face opposed to the lower face, and a side face different from the lower and upper faces, the insulating film being formed on the upper face of the first magnetic layer and serving as a channel; a second magnetic layer formed on the upper face of the insulating film and serving as the other one of the source and the drain; a gate electrode formed along the side face of the insulating film; and a gate insulating film located between the gate electrode and the side face of the insulating film.

15 Claims, 10 Drawing Sheets

(56) References Cited

U.S. PATENT DOCUMENTS

| | | | |
|---|---|---|---|
| 2008/0067501 A1* | 3/2008 | Sugahara et al. | 257/38 |
| 2008/0165454 A1* | 7/2008 | Kajiyama | 360/324.2 |
| 2008/0217711 A1* | 9/2008 | Sugiyama et al. | 257/421 |
| 2008/0308853 A1* | 12/2008 | Sugahara et al. | 257/295 |
| 2009/0039401 A1* | 2/2009 | Tanaka et al. | 257/295 |
| 2009/0057793 A1* | 3/2009 | Koga | 257/421 |
| 2010/0244897 A1* | 9/2010 | Saito et al. | 326/49 |

FOREIGN PATENT DOCUMENTS

| | | |
|---|---|---|
| JP | 2009-064826 | 3/2009 |
| JP | 2009-135533 | 6/2009 |
| JP | 2010-225835 A | 10/2010 |
| WO | WO 2006/100835 A1 | 9/2006 |

OTHER PUBLICATIONS

Office Action mailed May 30, 2014, in Japanese Patent Application No. 2011-209915, filed Sep. 26, 2011 (with English-language translation).

Office Action issued Sep. 2, 2014 in Japanese Patent Application No. 2011-209915 with English language translation.

\* cited by examiner

SPIN TRANSISTOR AND MEMORY

CROSS-REFERENCE TO RELATED APPLICATION

This application is based upon and claims the benefit of priority from prior Japanese Patent Application No. 2011-209915 filed on Sep. 26, 2011 in Japan, the entire contents of which are incorporated herein by reference.

FIELD

Embodiments described herein relate generally to spin transistors and memories.

BACKGROUND

In recent years, studies on novel devices using charge properties and spin properties of electrons at the same time are becoming more and more active. A spin transistor that is one of those novel devices uses a magnetic material as a source electrode and a drain electrode connected to each other via a semiconductor. In such a spin transistor, output characteristics can be controlled by changing the relative magnetization directions of the source electrode and the drain electrode. Specifically, the following features are utilized. When the relative magnetization directions of the source electrode and the drain electrode are substantially parallel to each other, the drain current ($I_D^P$) increases. When the relative magnetization directions are substantially antiparallel to each other, the drain current ($I_D^{AP}$) decreases. Where spin transistors are used in a memory or a reconfigurable logic circuit, it is necessary to increase the $I_D^P/I_D^{AP}$ ratio, which is the drain current change that occurs when the relative magnetization directions are switched between a substantially parallel state and a substantially antiparallel state. At present, however, the $I_D^P/I_D^{AP}$ ratio achieved via a semiconductor is not sufficiently high. Therefore, there is a demand for an improvement or a novel structure for increasing the $I_D^P/ID^{AP}$ ratio.

DETAILED DESCRIPTION

A spin transistor according to an embodiment includes: a first magnetic layer formed above a substrate and serving as one of a source and a drain; an insulating film having a lower face facing to an upper face of the first magnetic layer, an upper face opposed to the lower face, and a side face different from the lower and upper faces, the insulating film being formed on the upper face of the first magnetic layer and serving as a channel; a second magnetic layer formed on the upper face of the insulating film and serving as the other one of the source and the drain; a gate electrode formed along the side face of the insulating film; and a gate insulating film located between the gate electrode and the side face of the insulating film.

The following is a description of embodiments, with reference to the accompanying drawings.

First Embodiment

Figure 1:
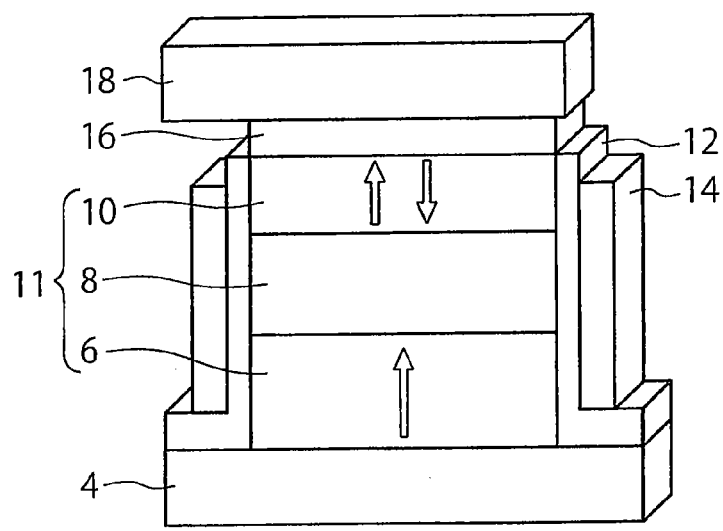
FIG. 1 is a perspective view showing the structure of a spin transistor according to a first embodiment.

FIG. 1 shows the structure of a spin transistor according to a first embodiment. The spin transistor 1 of this embodiment has a stacked film 11 on a lower electrode 4. The stacked film 11 is formed by stacking a ferromagnetic layer 6, an insulating film 8, and a ferromagnetic layer 10 in this order. A gate insulating film 12 is formed along the side faces of the stacked film 11, and a gate electrode 14 is provided on the opposite sides of the gate insulating film 12 from the side faces of the stacked film 11. That is, the gate insulating film 12 is provided between the side portions of the stacked film 11 and the gate electrode 14. Here, the gate insulating film 12 should be formed at least along the side faces of the insulating film 8. Although the stacked film 11 is formed on the lower electrode 4 made of a metal, the stacked film 11 can be formed on a semiconductor layer.

In this embodiment, the gate electrode 14 is electrically insulated from the lower electrode 4 by the gate insulating film 12. Instead of the gate insulating film 12, another insulating film can be used for the electrical insulation between the gate electrode 14 and the lower electrode 4. A cap layer 16 made of a conductive material is provided on the ferromagnetic layer 10, and an upper electrode 18 is provided on the cap layer 16. The area of the film plane of the cap layer 16 perpendicular to the stacking direction is equal to or smaller than the area of the film plane of the magnetic layer 10.

The ferromagnetic layer 6 is a magnetization fixed layer having a fixed magnetization direction, and the ferromagnetic layer 10 is a recording layer having a changeable magnetization direction. Here, a fixed magnetization direction means that the magnetization direction does not change before and after a write current is flowed to the ferromagnetic layer, and a changeable magnetization direction means that the magnetization direction is changeable before and after a write current is flowed to the ferromagnetic layer. It should be noted that the ferromagnetic layer 6 can be a recording layer while the ferromagnetic layer 10 can be a magnetization fixed layer.

The ferromagnetic layers 6 and 10 can be perpendicular magnetization films each having a magnetization direction perpendicular to the film plane, or can be in-plane magnetization films each having a magnetization direction parallel to the film plane. Here, the "film plane" is the upper face of each ferromagnetic layer. The ferromagnetic layers 6 and 10 can be stacked films each including magnetic layers to adjust the characteristics of magnetic materials.

Operating Principles

Figure 2:
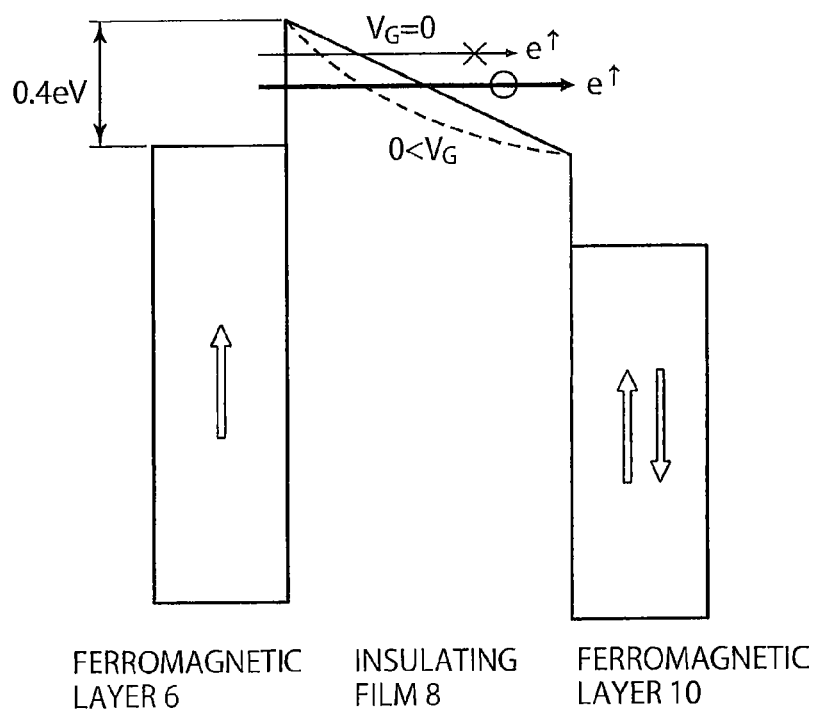
FIG. 2 is a band diagram for explaining the operating principles of the spin transistor according to the first embodiment.

Referring now to FIG. 2, the operating principles of the spin transistor of this embodiment are described. First, a case where no voltage is applied between the ferromagnetic layer 6 and the ferromagnetic layer 10 as shown in FIG. 2 is described. If the film thickness of the insulating film 8 located between the ferromagnetic layer 6 and the ferromagnetic layer 10 is sufficiently great, any electronic current does not flow between the ferromagnetic layer 6 and the ferromagnetic layer 10 in a case where no voltage is applied to the gate electrode 14 (see the arrows with the thinner solid line in FIG. 2).

Next, a case where a voltage is applied to the gate electrode 14 is described. When a positive voltage is applied to the gate electrode 14, the energy level of the conduction band of the insulating film 8 is lowered as indicated by the dashed line in FIG. 2. As a result, an electronic current flows between the ferromagnetic layer 6 and the ferromagnetic layer 10 due to a F-N (Fowler-Nordheim) tunneling mechanism (see the arrow with the thicker solid line in FIG. 2). The equivalent oxide thickness (EOT) of the insulating film 8 in which a F-N tunneling current flows is preferably 10 to 100 angstroms.

As described above, the current flowing between the ferromagnetic layer 6 and the ferromagnetic layer 10 can be controlled by the voltage applied to the gate electrode 14 formed along the side portions of the insulating layer 8. That is, the insulating film 8 serves as a channel. One of the ferromagnetic layers 6 and 10 serves as one of a source and a drain. For example, one of the ferromagnetic layers 6 and 10 serves as the source (a source electrode), and the other one of the ferromagnetic layers 6 and 10 serves as the drain (a drain electrode).

Further, the current flowing between the ferromagnetic layer and the ferromagnetic layer 10 depends on the relative magnetization directions of the ferromagnetic layers 6 and 10. Normally, the current $I_D^P$ flowing when the relative magnetization directions of the ferromagnetic layer 6 and the ferromagnetic layer 10 are parallel to each other is larger than the current $I_D^{AP}$ flowing when those relative magnetization directions are antiparallel to each other. However, the combination of materials of the ferromagnetic layer 6 and the ferromagnetic layer 10 can be selected such that the current $I_D^P$ flowing when the relative magnetization directions are parallel to each other would decrease, and the current $I_D^{AP}$ flowing when the relative magnetization directions are antiparallel to each other would increase.

Also, the spin transistor of this embodiment can be used as a storage element of a memory. In this case, the data "0" and the data "1" are associated with the parallel state and the antiparallel state, respectively, between the magnetization direction of the ferromagnetic layer serving as the recording layer and the magnetization direction of the ferromagnetic layer serving as the magnetization fixed layer. Alternatively, the data "1" can be associated with the parallel state, and the data "0" can be associated with the antiparallel state.

To switch the magnetization direction of the ferromagnetic layer serving as the recording layer from an antiparallel state to a parallel state, a voltage is applied to the gate electrode to put the spin transistor into an on state, and an electronic current is applied from the ferromagnetic layer serving as the magnetization fixed layer to the ferromagnetic layer serving as the recording layer via the insulating film 8. In that case, the electrons spin-polarized by the magnetization fixed layer flow into the recording layer through the insulating film 8, and allow a spin torque to be applied to the magnetization of the recording layer. As a result, the magnetization direction of the recording layer is shifted into a parallel state. The electronic current flows in the opposite direction of the normal current flow.

To switch the magnetization direction of the ferromagnetic layer serving as the recording layer from a parallel state to an antiparallel state, a voltage is applied to the gate electrode to put the spin transistor into an on state, and an electronic current is applied from the ferromagnetic layer serving as the recording layer to the ferromagnetic layer serving as the magnetization fixed layer via the insulating film 8. In that case, the electrons spin-polarized by the recording layer flow into the magnetization fixed layer through the insulating film 8. The electrons with spins oriented in the same direction as the magnetization direction of the magnetization fixed layer pass through the magnetization fixed layer. However, the electrons with spins oriented in the opposite direction from the magnetization direction of the magnetization fixed layer are reflected at the interface between the magnetization fixed layer and the insulating film 8, and flow into the recording layer through the insulating film 8. The electrons then allow a spin torque to be applied to the magnetization of the recording layer, and put the magnetization of the recording layer into an antiparallel state.

In the above manner, the magnetization direction of the recording layer can be put into a parallel state or an antiparallel state with respect to the magnetization direction of the magnetization fixed layer, or writing can be performed. It should be noted that reading is performed by applying a voltage between the recording layer and the magnetization fixed layer and detecting the flowing current. In this manner, the data "0" or "1" is read out.

Next, the advantages of the spin transistor of this embodiment are described. First, in a conventional spin transistor, a semiconductor is used as the channel. A spin transistor having a semiconductor used as the channel is theoretically expected to achieve a high $I_D^P/I_D^{AP}$ ratio. However, experiments have found that a high $I_D^P/I_D^{AP}$ ratio sufficient to be put into practical use has yet to be realized.

In the spin transistor of this embodiment, on the other hand, an insulator is used as the channel, and more specifically, an insulating film having an epitaxial structure or an oriented structure, such as a MgO film, is used as the channel. It is known that, in such a case, a high resistance change rate is realized by virtue of a spin filtering effect of the $\Delta_1$ band. In a conventional MTJ (Magnetic Tunnel Junction), an insulating film having a film thickness such that a tunneling current can flow directly between the two ferromagnetic layers is used. In the spin transistor of this embodiment, on the other hand, a thick insulating film is used so that a tunneling current hardly flows directly between the two ferromagnetic layers in a case where a gate voltage is not applied. Normally, in an insulating film having an epitaxial structure or an oriented structure, such as a MgO film, the crystallinity or the orientation is improved as the film thickness of the insulating film becomes greater. Accordingly, an insulating film with higher quality than the quality of the insulating film of a conventional MTJ can be obtained. As a result, a greater spin filtering effect can be expected, and a higher MR ratio can be achieved. Also, the $I_D^P/I_D^{AP}$ ratio can be made higher.

Also, the use of a structure formed by vertically stacking the ferromagnetic layer 6, the insulating film 8, and the ferromagnetic layer 10 as in the spin transistor of this embodiment, or the use of a vertically arranged structure formed by vertically arranging the ferromagnetic layer 6, the insulating film 8, and the ferromagnetic layer 10 brings about the following advantages.

First, a general spin transistor has a structure in which two electrodes including ferromagnetic layers and a gate electrode are arranged in a flat plane, or has a horizontally arranged structure. Therefore, at the time of manufacture, patterning needs to be performed on each of the electrodes including the ferromagnetic layers and the gate electrode independently, and therefore, a distance is formed between the two electrodes including the ferromagnetic layers and the gate electrode. Due to this distance, the $I_D^P/I_D^{AP}$ ratio becomes lower, and the device size becomes very large.

In this embodiment, on the other hand, the distance between the ferromagnetic layers 6 and 10 is defined only by the film thickness of the insulating film 8, and accordingly, the device size is restrained from becoming very large. Also, by stacking the layers vertically, the film formation method normally used for MTJs and the like can be used, and a high-quality stacked structure formed with the ferromagnetic layer 6, the insulating film 8, and the ferromagnetic layer 10 can be used.

Also, by using the vertically arranged structure according to this embodiment, a simple manufacturing method can be utilized. Accordingly, a spin transistor can be manufactured at a low cost. Referring now to FIGS. 3(a) through 3(d), a specific example of the manufacturing method is described.

First, by using a sputtering technique or an electron-beam deposition technique, the lower electrode 4, the ferromagnetic layer 6, the insulating film 8, and the ferromagnetic layer 10 are stacked in this order, to form a stacked film. The stacked structure 11 formed with the ferromagnetic layer 6, the insulating film 8, and the ferromagnetic layer 10 is then processed into a pillar-like form, using photolithography, RIE, ion milling, or the like (FIG. 3(a)).

Figure 3:
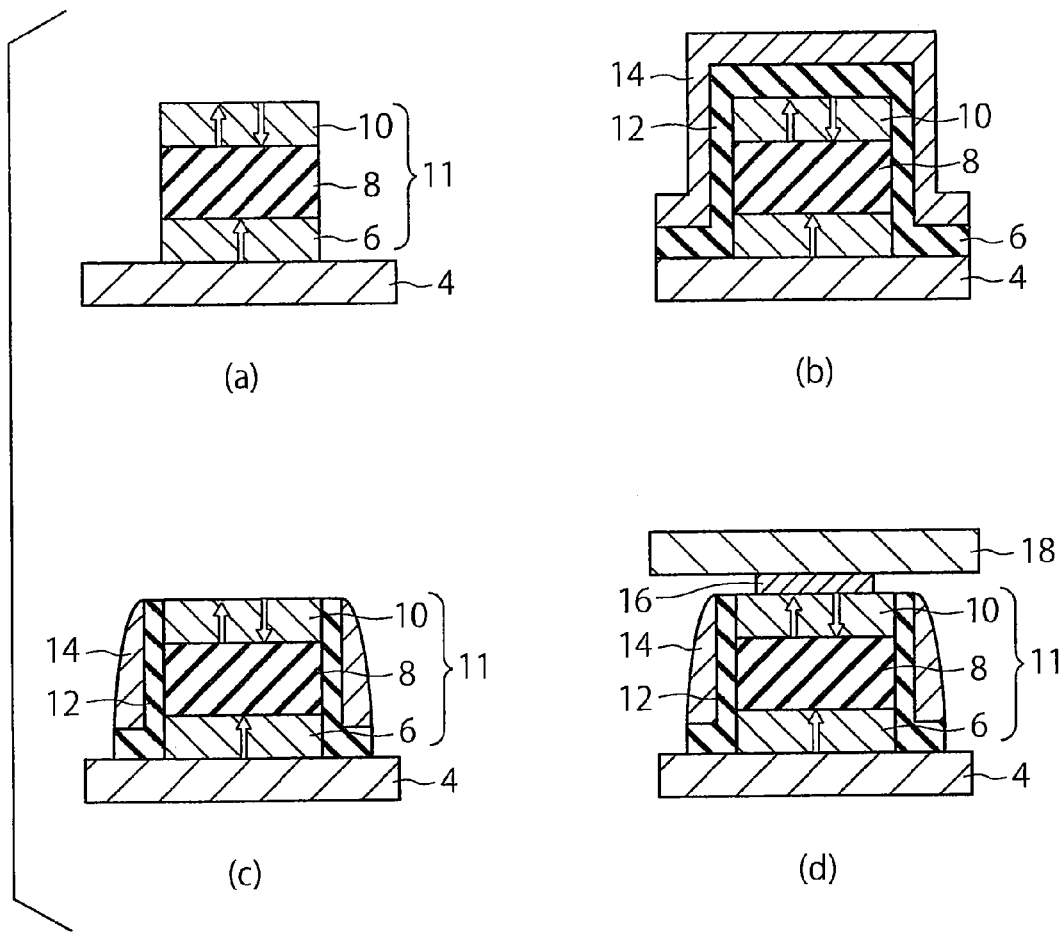
FIG. 3(a) through FIG. 3(d) are cross-sectional views illustrating a method of manufacturing the spin transistor according to the first embodiment.

The gate insulating film 12 and the gate electrode 14 are then sequentially formed, to cover the above-described stacked structure 11 (FIG. 3(b)). After that, a resist pattern (not shown) made of a photoresist is formed by photolithography. With this resist pattern serving as a mask, RIE (Reactive Ion Etching) is performed. As a result, the gate insulating film 12 and the gate electrode 14 are left along the side portions of the pillar-like stacked structure 11 (FIG. 3(c)).

An interlayer insulating film (ILD (Inter-Layer Dielectric)) (not shown) is then formed in order to cover the lower electrode 4, the pillar-like stacked structure 11, the gate insulating film 12, and the gate electrode 14. After that, etchback is performed to form a hole that leads to the top portion of the pillar-like stacked structure 11 through the interlayer insulating film. In this step, a via-hole forming process that combines photolithography and RIE or the like can be used. Lastly, the hole or the via is filled with an electrode material. Patterning is then performed on the electrode material, thereby forming the cap layer 16 and the upper electrode 18 (FIG. 3(d)). In this manner, the spin transistor of this embodiment illustrated in FIG. 1 is completed. This spin transistor also functions as a storage element, and is to be a memory cell of a spin memory.

Figure 4:
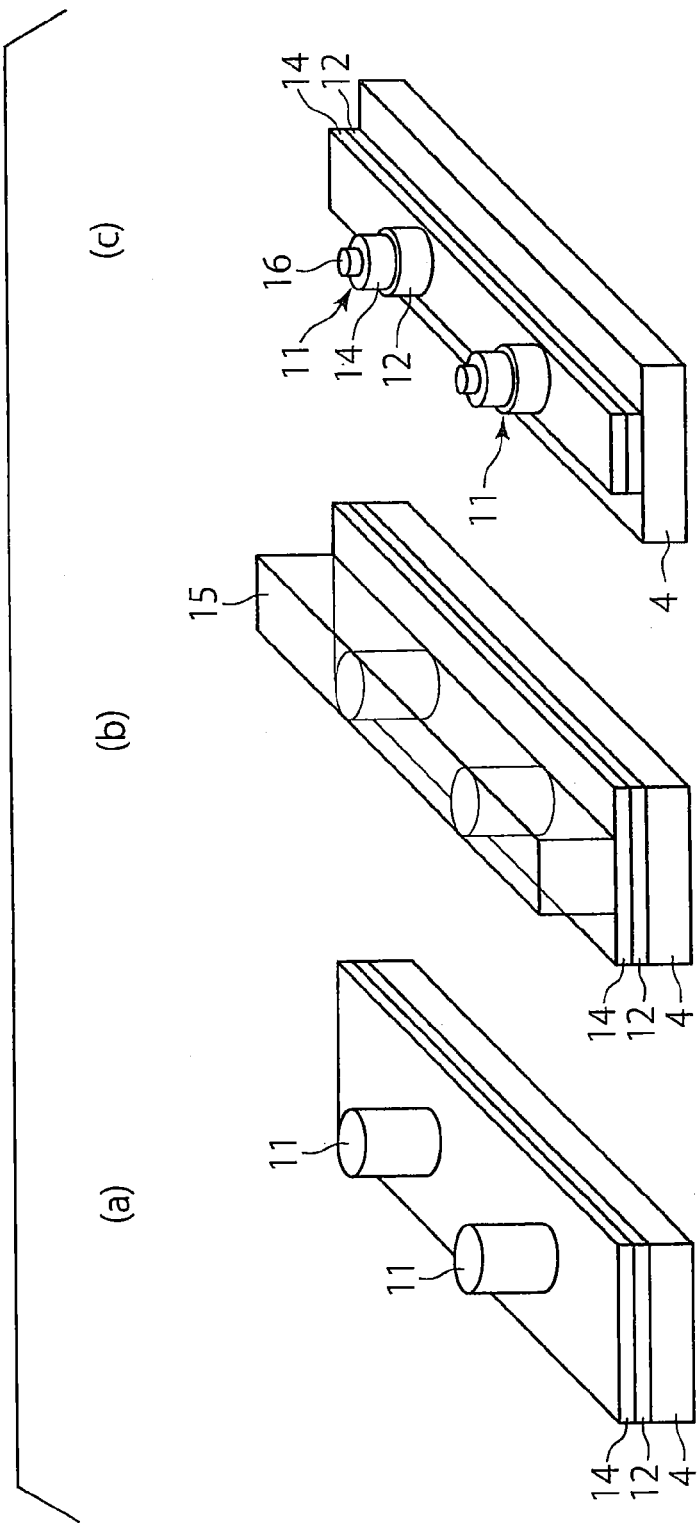
FIG. 4(a) through FIG. 4(c) are perspective views illustrating a method of manufacturing a memory that includes the spin transistor of the first embodiment as a memory element.

Using this process, a spin memory including spin transistors in an array can be easily formed, as illustrated in FIGS. 4(a) through 4(c). Specifically, pillar-like stacked structures 11 each including the ferromagnetic layer 6, the insulating film 8, and the ferromagnetic layer 10 as shown in FIG. 3(a) are formed on the lower electrode 4. After that, the gate insulating film 12 and the gate electrode 14 are sequentially stacked, to cover the pillar-like stacked structures 11 and the lower electrode 4 (see FIG. 4(a)). In FIG. 4(a), only one row of pillar-like stacked structures 11 is shown. After that, a resist pattern 15 is formed, to cover the pillar-like stacked structures 11, as shown in FIG. 4(b). With this resist pattern 15 serving as a mask, patterning is performed on the gate electrode 14 and the gate insulating film 12. As a result, each of the pillar-like stacked structures 11 has a cross section as shown in FIG. 3(c), and the stacked film formed with the gate insulating film 12 and the gate electrode 14 is left on the lower electrode 4 between the pillar-like stacked structures 11 covered with the resist pattern 15 (FIG. 4(c)). In FIG. 4(c), the cap layer 16 is provided on each of the pillar-like stacked structures 11.

Figure 5:
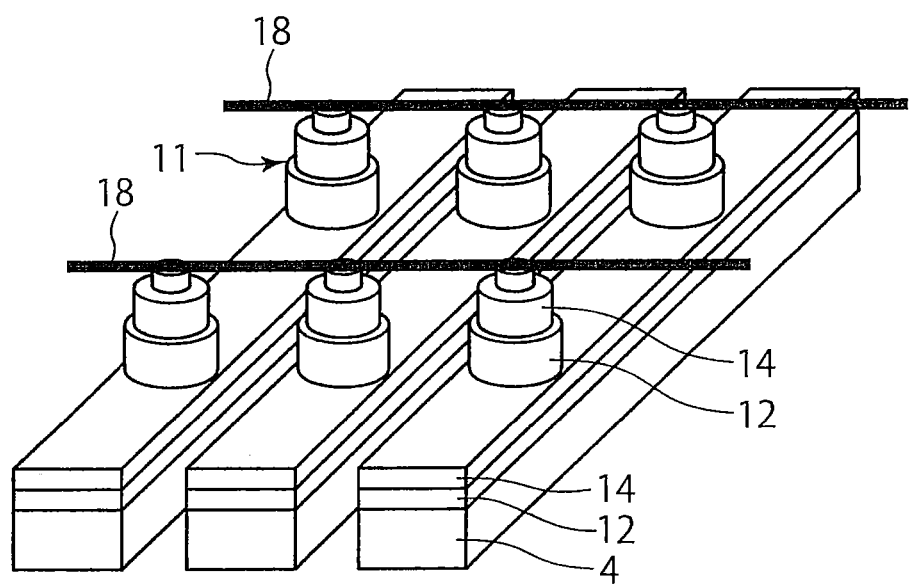
FIG. 5 is a perspective view illustrating a memory manufactured by the manufacturing method illustrated in FIG. 4.

After that, as shown in FIG. 5, the cap layers 16 on the pillar-like stacked structures 11 arranged in directions perpendicular to the lower electrodes 4 are connected by the upper electrodes 18, to form a memory that has the spin transistors arranged in an array as the storage elements. A select line for selecting the corresponding spin transistor is connected to the gate electrode of each of the spin transistors.

This memory is a cross-point memory that includes spin transistors serving as storage elements, and achieves high integration.

Figure 6:
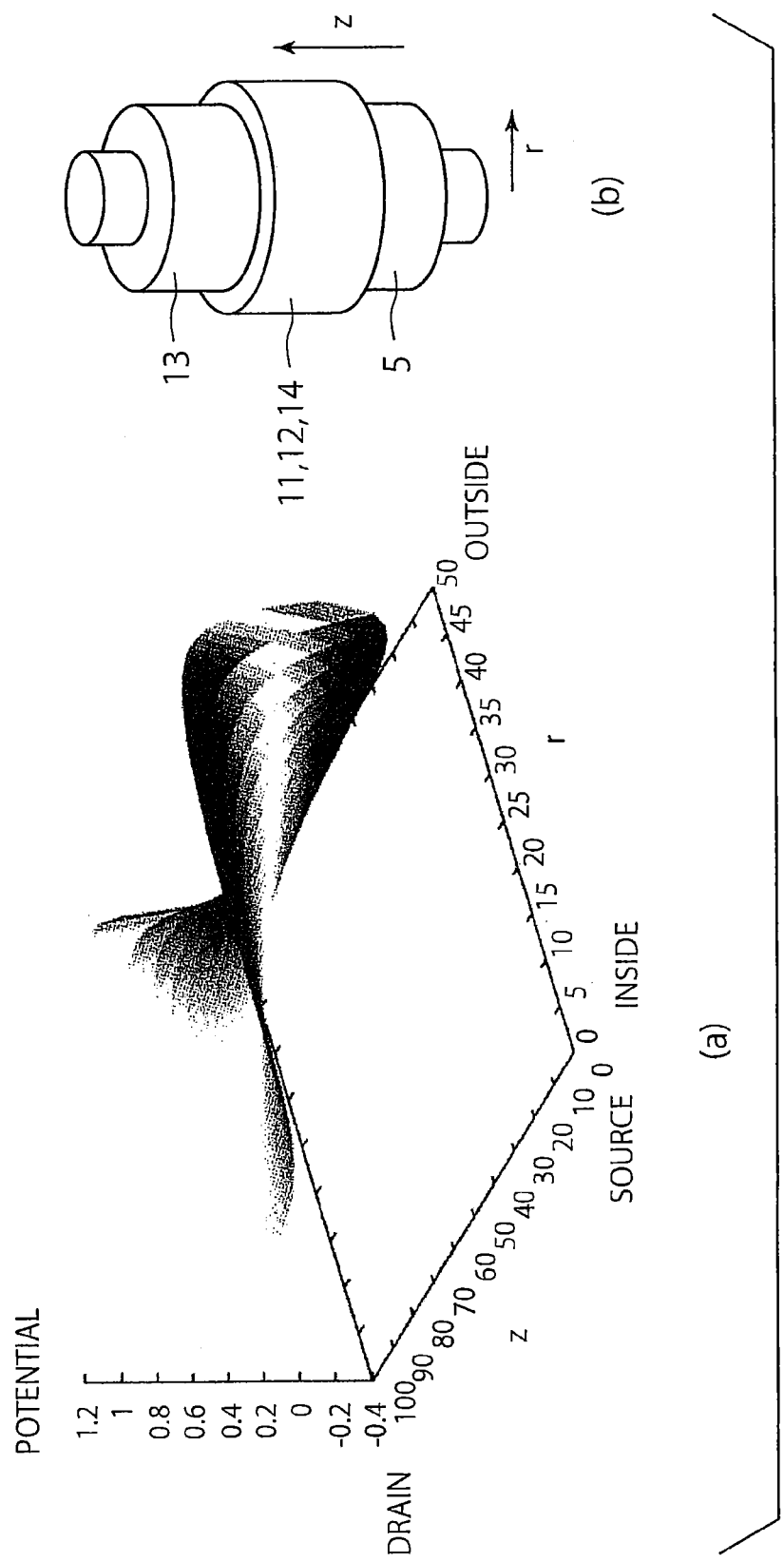
FIGS. 6(a) and 6(b) are diagrams for explaining the characteristics of the spin transistor according to the first embodiment.

Referring now to FIGS. 6(a) and 6(b), the characteristics of the spin transistor according to this embodiment are described. FIG. 6(a) is a graph showing the results of a numerical simulation. FIG. 6(b) is a diagram showing the spin transistor modeled for use in the simulation. As shown in FIG. 6(b), this model has a structure in which the cylindrical stacked film 11 formed with the ferromagnetic layer 6, the insulating film 8, and the ferromagnetic layer 10 is surrounded by the gate insulating film 12 and the gate electrode 14. The potential distribution of the conduction band of the insulating film 8 in this model was calculated. It should be noted that, in this model, a source electrode 5 is connected to the ferromagnetic layer 6, and a drain electrode 13 is connected to the ferromagnetic layer 10. It was assumed that the insulating film 8 was a MgO film, and the barrier height of the MgO seen from the ferromagnetic layer 6 was set at 0.4 eV, as shown in FIG. 2. FIG. 6(a) shows the potential distribution of the conduction band of the insulating film 8 when the voltage applied between the ferromagnetic layers 6 and 10 was 1 V while the voltage applied to the gate electrode 14 was 1 V. As can be seen from FIG. 6(a), the potential of the insulating film 8 becomes lower in the vicinity of the gate electrode 14 when a voltage is applied to the gate electrode 14.

Figure 7:
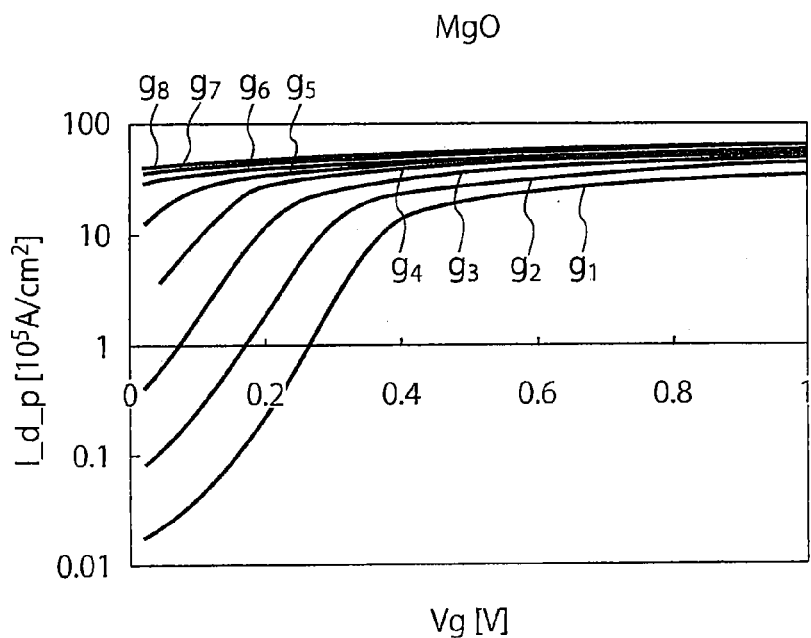
FIG. 7 is a graph showing the results of calculations of currents flowing between the ferromagnetic layers of the spin transistor according to the first embodiment.

FIG. 7 shows the results of calculations of currents flowing between the ferromagnetic layers 6 and 10. The calculations were performed by using the potential distribution calculation results shown in FIG. 6(a). In FIG. 7, the abscissa axis indicates gate voltages Vg, and the ordinate axis indicates currents flowing between the ferromagnetic layers 6 and 10. Here, the currents are converted into current densities I_d_p. It should be noted that FIG. 7 shows the results of calculations performed in a case where the magnetization directions of the ferromagnetic layers 6 and 10 were parallel to each other. The graphs $g_1$ through $g_8$ were obtained where the voltage Vdd applied between the ferromagnetic layers 6 and 10 was used as the parameter and was varied from 0.10 V to 0.8 V by 0.1 V. As can be seen from FIG. 7, where the voltage Vdd is constant, the current density becomes higher as the gate voltage Vg becomes higher. However, the rate of the increases becomes lower as the gate voltage becomes higher. Also, at the same gate voltage Vg, the current density becomes higher as the voltage Vdd becomes higher. The rate of the increases is higher where the gate voltage is lower. As can be seen from the characteristics shown in FIG. 7, so-called transistor characteristics in which the current flowing between the ferromagnetic layers 6 and 10 varies with changes in the gate voltage are realized.

Figure 8:
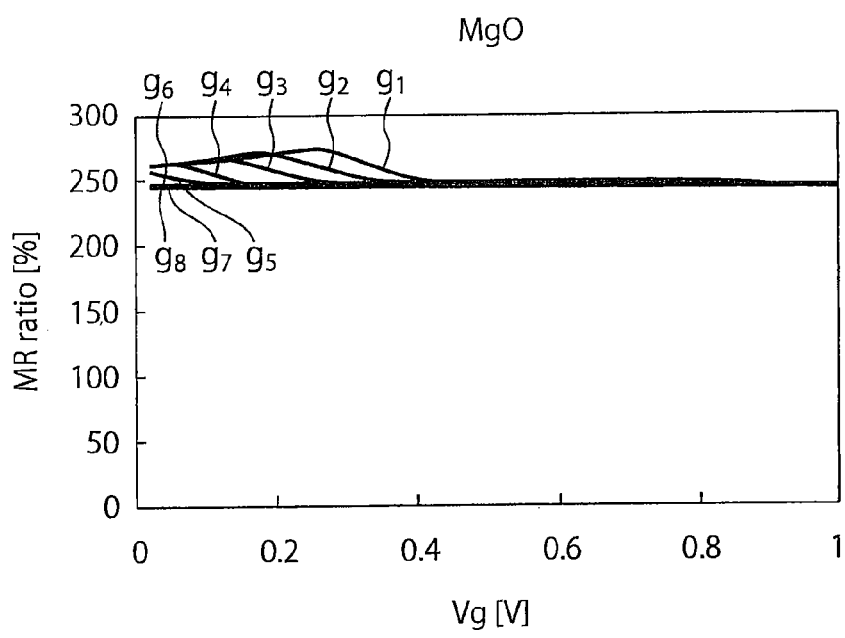
FIG. 8 is a graph showing the results of calculations of currents flowing between the ferromagnetic layers of the spin transistor according to the first embodiment.

FIG. 8 shows the results of current change rate calculations performed where the relative magnetization directions of the two ferromagnetic layers 6 and 10 were antiparallel to each other. The abscissa axis indicates gate voltages Vg, and the ordinate axis indicates MR ratios corresponding to current change rates. The graphs $g_1$ through $g_8$ were obtained where the voltage Vdd applied between the ferromagnetic layers 6 and 10 was used as the parameter and was varied from 0.10 V to 0.8 V by 0.1 V. As can be seen from FIG. 8, high MR ratios of approximately 250%, i.e., current change rates are realized. Accordingly, as can be seen from FIGS. 7 and 8, the spin transistor of this embodiment can achieve transistor characteristics as well as high current change rates.

Next, the materials of the respective components forming the spin transistor of this embodiment are described. In the spin transistor of this embodiment, the materials mentioned below can be used.

First, each of the ferromagnetic layers 6 and 10 preferably has unidirectional anisotropy. The film thickness of each of the ferromagnetic layers 6 and 10 is preferably 0.1 nm to 100 nm. Furthermore, the film thickness of each of the ferromagnetic layers 6 and 10 needs to be such that those ferromagnetic layers 6 and 10 do not become superparamagnetic, and therefore, is more preferably 0.4 nm or greater. As for the material of each of the ferromagnetic layers 6 and 10, it is possible to use a Heusler alloy such as $Co_2FeAl_{1-x}Si_x$ or $Co_2Mn_{1-x}Fe_xSi$.

It is also possible to use Co, Fe, Ni, an alloy of Co, Fe, or Ni, Co—Pt, Co—Fe—Pt, Fe—Pt, Co—Fe—Cr—Pt, Co—Cr—Pt, Co—Pd, or an alloy such as NiMnSb, $Co_2MnGe$, $Co_2MnAl$, $Co_2MnSi$, or CoCrFeAl.

It is also possible to use a magnetic material made of a magnetic semiconductor such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

Magnetic properties or various physical properties such as crystallinity, mechanical properties, and chemical properties can be adjusted by adding a nonmagnetic element, such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium), to any of the above mentioned magnetic materials. As the ferromagnetic layers 6 and 10, in-plane magnetization films can be used, or perpendicular magnetization films or films having oblique magnetization can be used. Particularly, in a case where perpendicular magnetization films are used, the current density can be lowered when the later-described spin-injection writing is performed, and high thermal stability can be achieved.

Also, the magnetization directions of the ferromagnetic layers can be controlled by applying an antiferromagnetic layer, such as Fe—Mn (iron-manganese), Pt—Mn (platinum-manganese), Pt—Cr—Mn (platinum-chromium-manganese), Ni—Mn (nickel-manganese), Ir—Mn (iridium-manganese), NiO (nickel oxide), or $Fe_2O_3$ (ferric oxide), to the ferromagnetic layer to be the magnetization fixed layer, or the ferromagnetic layer 6, for example.

As for the insulating film 8, it is possible to use an oxide or a nitride of Si, Ge, Al, Ga, Mg, Ti, Zr, Ta, Sr, Ce, or the like, or SrTiO, NdGaO, MgAlO (magnesium aluminum oxide), LaSrO (lanthanum strontium oxide), or the like.

When writing is performed in the spin transistor of this embodiment, a voltage is applied to the gate electrode 14, to flow a current between the ferromagnetic layers 6 and 10. This is because, where the amount of the current to be applied exceeds a critical value, the magnetization direction of the ferromagnetic layer serving as the recording layer is changed due to spin-injection magnetization switching. It should be noted that, at the time of reading, it is important to perform the reading with a current that does not exceed the critical current.

Figure 9:
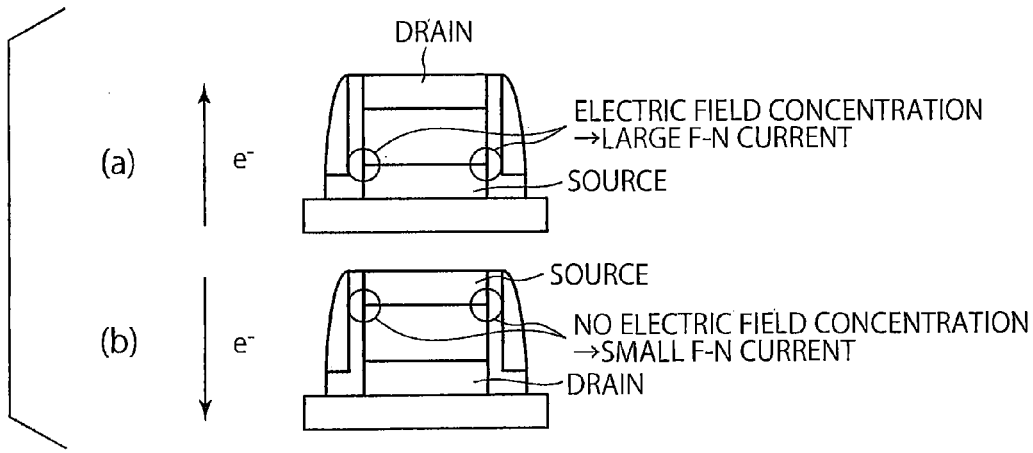
FIGS. 9(a) and 9(b) are diagrams for explaining that the magnetization fixed layer is located above the recording layer.
Figure 10:
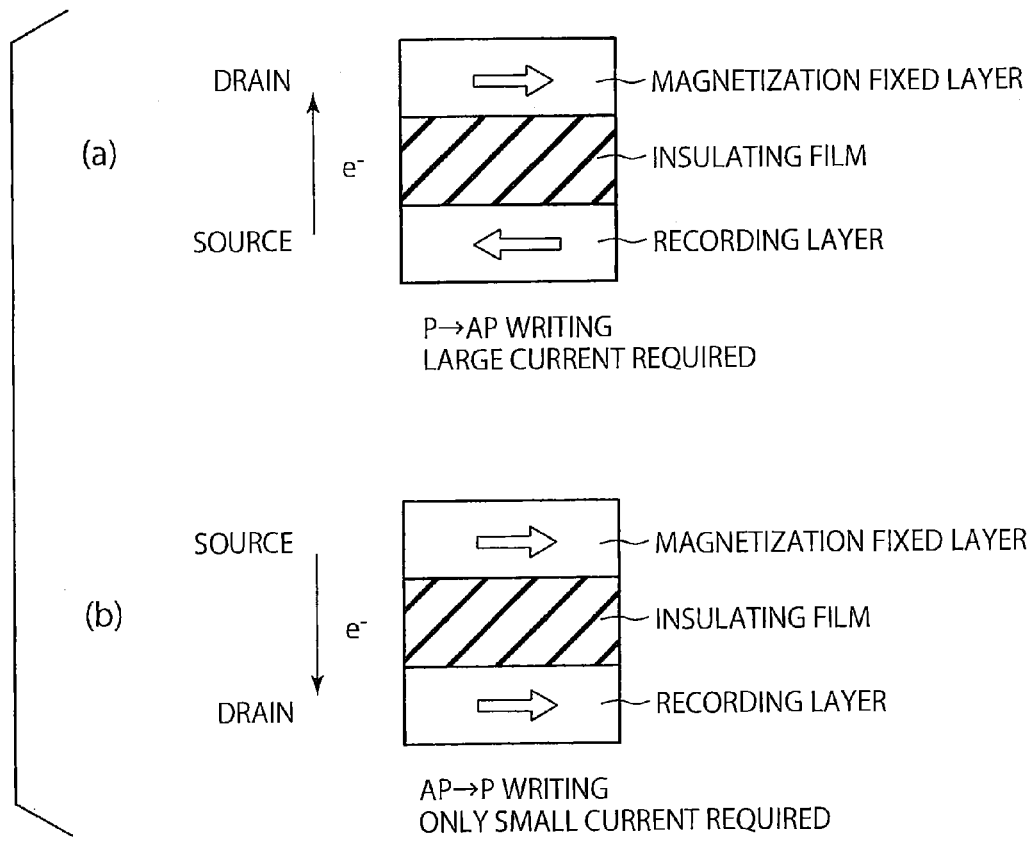
FIGS. 10(a) and 10(b) are diagrams for explaining that the magnetization fixed layer is located above the recording layer.

In this embodiment, the magnetization fixed layer is preferably provided at the upper portion of the device, so as to perform efficient writing. In a vertically arranged device structure, as shown in FIG. 9(a), the corners of the gate electrode are angular, and therefore, an electric field tends to be concentrated in the vicinity of the lower ferromagnetic layer. Accordingly, a larger amount of current can be made to flow. In view of this, as shown in FIG. 9(b), the lower ferromagnetic layer is used as the drain electrode, and the upper ferromagnetic layer is used as the source drain electrode. In this case, an electric field is not concentrated on the source electrode side. Accordingly, a smaller amount of current can be made to flow. In normal spin-injection magnetization switching, a larger amount of current is required when the relative magnetization directions of the recording layer and the magnetization fixed layer are switched from a parallel state (a P state) to an antiparallel state (an AP state) by flowing an electronic current from the recording layer to the magnetization fixed layer. Accordingly, by providing the magnetization fixed layer at the upper portion as shown in FIGS. 10(a) and 10(b), the amount of the current required for the switching from a parallel state to an antiparallel state can be secured. The up arrow and the down arrow shown in FIGS. 10(a) and 10(b) indicate the directions in which an electronic current $e^-$ flows. With this arrangement, in which the upper ferromagnetic layer shown in FIGS. 9(a) and 9(b) is used as the magnetization fixed layer and the lower ferromagnetic layer shown in FIGS. 9(a) and 9(b) is used as the recording layer, writing can be efficiently performed. It should be noted that the structure illustrated in FIG. 10 is merely an example, and, in a device structure in which a gate electric field is concentrated on the side of the upper ferromagnetic layer, the magnetization fixed layer should preferably be provided on the side of the lower ferromagnetic layer. Also, in a device structure where a larger amount of current is required when the magnetization state is switched from an antiparallel state to a parallel state, the magnetization fixed layer is preferably provided on the side of the lower ferromagnetic layer.

It should be noted that this embodiment is not restricted by the above description. For example, the channel is not necessarily of an enhanced type, but can be of a depletion type. Also, an integrated circuit can be formed using the spin transistor of the above-described embodiment. A memory including the spin transistor of the above-described embodiment as a storage element in each memory cell can be formed. Further, the spin transistor of the above-described embodiment can be used as a transistor of an EEPROM (Electrically Erasable Programmable Read-Only Memory). Also, by using the spin transistor of this embodiment, a memory or integrated circuit that has simple peripheral circuits and a small area can be provided.

Second Embodiment

In the spin transistor of the first embodiment, the selection of the material of the insulating film 8 to be used as the channel and the material of the gate insulating film 12 is important in defining performance of the spin transistor. In view of this, in a spin transistor of a second embodiment, a case where the material of the insulating film 8 to be used as the channel and the material of the gate insulating film 12 are the same will be described.

Figure 11:
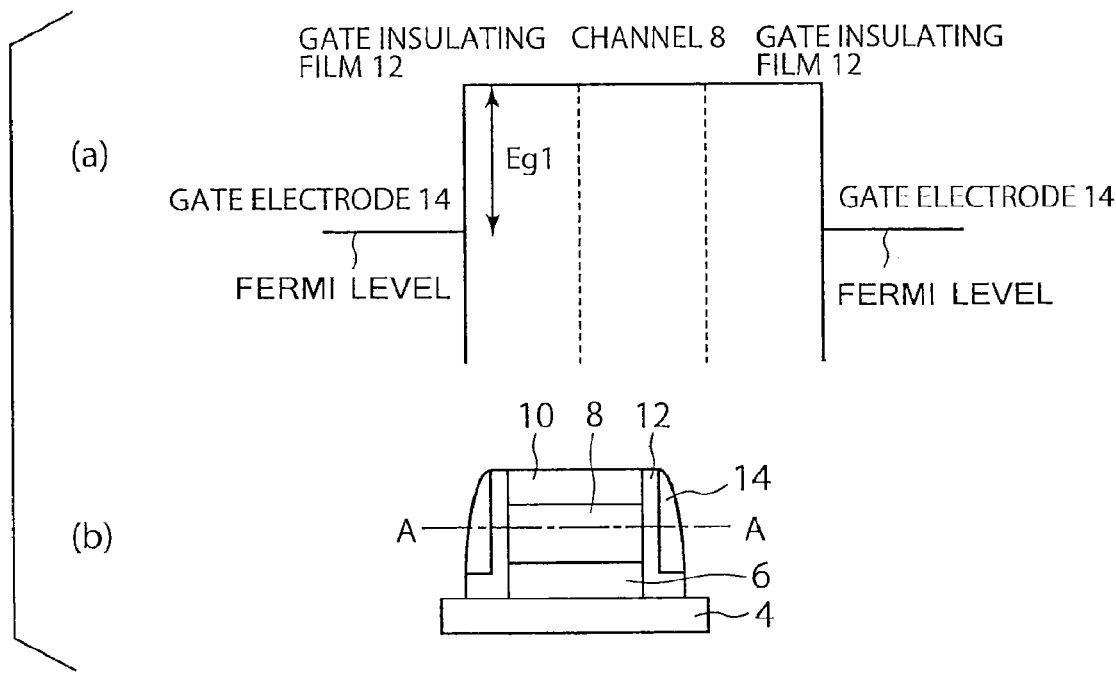
FIGS. 11(a) and 11(b) are diagrams for explaining the characteristics of a spin transistor according to a second embodiment.
Figure 12:
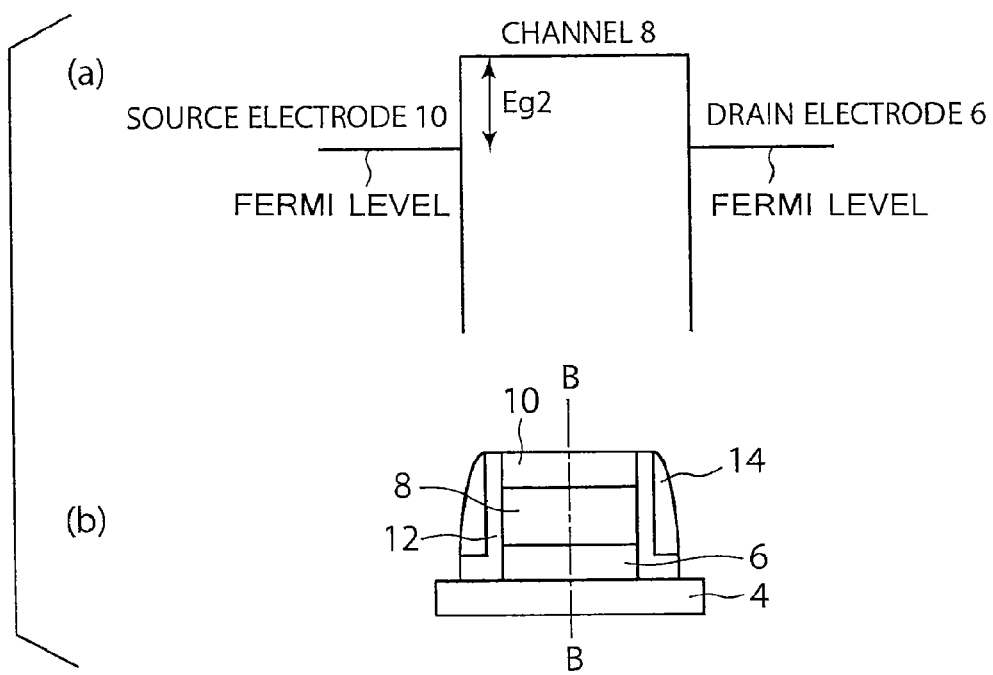
FIGS. 12(a) and 12(b) are diagrams for explaining the characteristics of a spin transistor according to the second embodiment.

FIGS. 11(a) and 12(a) show band diagrams obtained in a case where the material of the insulating film 8 to be used as the channel and the material of the gate insulating film 12 are the same. FIG. 11(a) is a band diagram of a cross section of the spin transistor taken along the section line A-A defined in FIG. 11(b). FIG. 12(a) is a band diagram of a cross-section of the spin transistor taken along the section line B-B defined in FIG. 12(b). Eg1 in FIG. 11(a) represents the energy difference between the Fermi level of the gate electrode 14 and the conduction band of the gate insulating film 12, and Eg2 in FIG. 12(a) represents the energy difference between the Fermi level of the source/drain electrodes 6 and 10 and the conduction band of the insulating film 8 to be used as the channel. If the material of the gate electrode 14 and the material of the source/drain electrodes 6 and 10 are the same, the energy difference Eg1 and the energy difference Eg2 have the same values. In that case, when a voltage is applied to the gate electrode 14, the amount of electrons flowing from the gate electrode 14 to the drain electrode 6 via the gate insulating film 12 becomes very large compared with the amount of electrons flowing between the source and the drain, and therefore, cannot be ignored. In this manner, a problem of so-called gate leakage current occurs.

To reduce the gate leakage current, materials should preferably be selected so that the energy difference Eg1 becomes larger than the energy difference Eg2. In an ideal situation, the energy difference Eg1 and the energy difference Eg2 are determined by the work functions of the gate electrode 14 and the source/drain electrodes 6 and 10. If the work function of the material to be used as the gate electrode 14 is larger than the work function of the material to be used as the source/drain electrodes 6 and 10, the energy difference Eg2 can be made larger than the energy difference Eg1. In an actual system, however, the energy differences are not determined only by the difference between the work functions, and therefore, attention is required.

To reduce the gate leakage in a more reliable manner, a semiconductor such as polysilicon can be used as the gate electrode 14. Where polysilicon is used as the gate electrode 14, a depletion layer is formed on the gate insulating film side of the semiconductor, and the depletion layer can effectively reduce leakage between the gate electrode 14 and the gate insulating film 12.

Third Embodiment

In a case where the material of the insulating film 8 to be used as the channel and the material of the gate insulating film 12 are the same as in the second embodiment, the gate leakage current can be reduced by selecting the materials to be used as the gate electrode 14 and the electrode between the source/drain electrodes 6 and 10. However, the gate leakage current can also be reduced by using different materials as the respective insulating films. Such a structure is now described as a third embodiment.

Figure 13:
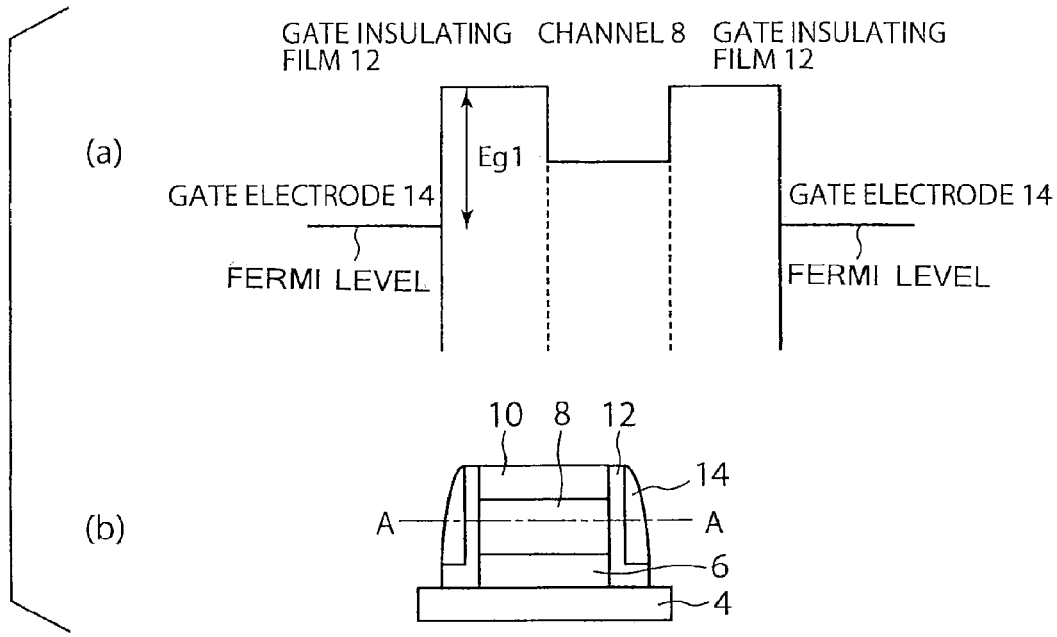
FIGS. 13(a) and 13(b) are diagrams for explaining the characteristics of a spin transistor according to a third embodiment.
Figure 14:
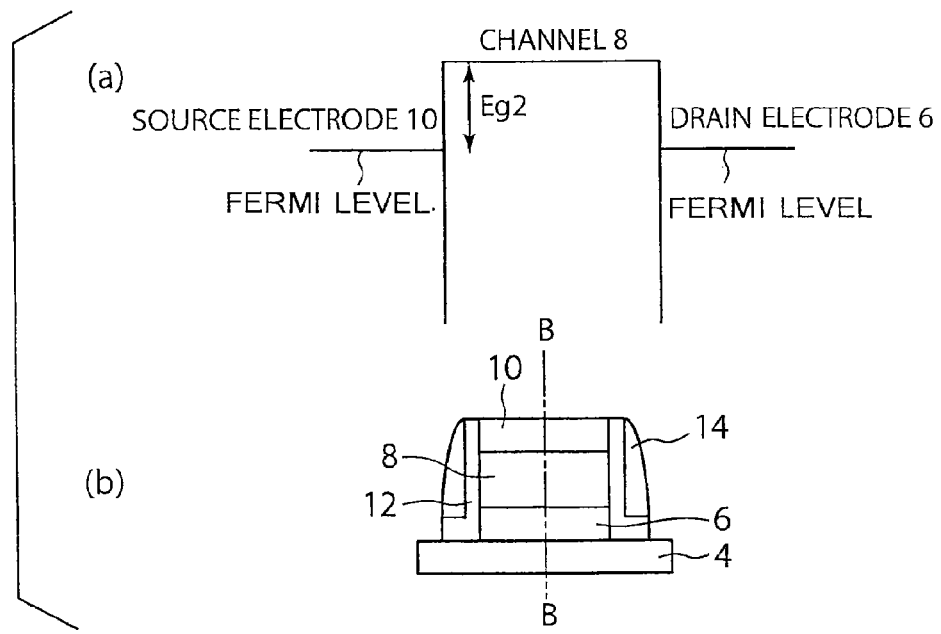
FIGS. 14(a) and 14(b) are diagrams for explaining the characteristics of a spin transistor according to the third embodiment.

FIGS. 13(a) and 14(a) show band diagrams obtained in a case where the material of the insulating film 8 to be used as the channel and the material of the gate insulating film 12 are different from each other. FIG. 13(a) is a band diagram of a cross section of the spin transistor taken along the section line A-A defined in FIG. 13(b). FIG. 14(a) is a band diagram of a cross-section of the spin transistor taken along the section line B-B defined in FIG. 14(b). Eg1 in FIG. 13(a) represents the energy difference between the Fermi level of the gate electrode 14 and the conduction band of the gate insulating film 12, and Eg2 in FIG. 14(a) represents the energy difference between the Fermi level of the source/drain electrodes 6 and 10 and the conduction band of the insulating film 8 to be used as the channel.

As can be seen from FIGS. 13(a) through 14(b), in a case where the material of the insulating film 8 to be used as the channel and the material of the gate insulating film 12 are different from each other, the combination of the materials should be used so that the energy difference Eg1 between the Fermi level of the gate electrode 14 and the conduction band of the gate insulating film 12 becomes larger than the energy difference Eg2 between the Fermi level of the source/drain electrodes 6 and 10 and the conduction band of the insulating film 8 to be used as the channel.

In a case where the material of the gate insulating film 12 and the material of the insulating film 8 to be used as the channel are different from each other, interdiffusion between the respective materials also needs to be taken into consideration. In the third embodiment, a channel is formed in the interface between the gate insulating film 12 and the insulating film 8 to be used as the channel, and electrons flow between the source and the drain. Therefore, in a case where interdiffusion has occurred between the gate insulating film 12 and the insulating film 8 to be used as the channel, a large number of electrons pass through the region in which the interdiffusion has occurred. If the spin polarizability of electrons becomes lower when the electrons are passing through the interdiffusing materials, the magnetoresistance ratio in the spin transistor becomes lower. Therefore, such a situation is not preferable. In view of this, a combination of insulating materials should be used such that the magnetoresistance ratio does not become lower even when interdiffusion occurs. Specifically, a combination of AlOx (aluminum oxide) and MgO (magnesium oxide) can be thought. This is because if the AlOx and the MgO interdiffuse, a spinel of MgxAlyOz (magnesium aluminum oxide) is formed, and a high spin polarizability can be maintained. Alternatively, a combination of a high-melting-point material such as ZrOx (zirconium oxide) and other materials can be used. This is because, in many cases, the temperature required for a high-melting-point material to form mixed crystals with another material is high. In many cases where ZrOx is used as a channel, the energy difference Eg2 becomes small. Therefore, in a case where an insulator such as SiOx (silicon oxide) is used as the gate insulating film, the energy difference Eg1 becomes larger than the energy difference Eg2. Accordingly, the gate leakage current is reduced for the above-described reasons, and an even higher magnetoresistance ratio can be realized.

If the value of the energy difference Eg1 and the value of the energy difference Eg2 are close to each other, the gate leakage can be reduced by making the EOT of the gate insulating film 12 greater than the EOT of the insulating film 8 to be the channel.

Fourth Embodiment

Figure 15:
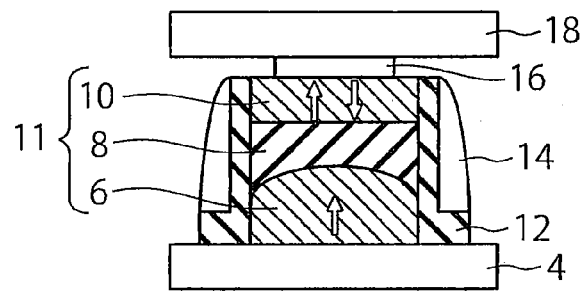
FIG. 15 is a cross-sectional view showing a spin transistor according to a fourth embodiment.

Referring now to FIG. 15, a spin transistor according to a fourth embodiment is described. FIG. 15 is a cross-sectional view of the spin transistor of the fourth embodiment. In the spin transistor of the fourth embodiment, the film thickness of the center portion of the lower ferromagnetic layer 6 is made greater than that in the first embodiment. With this arrangement, the electric field generated by a voltage applied between the source and the drain is concentrated on the center portion of the stacked film 11, and accordingly, the gate leakage current can be reduced.

Fifth Embodiment

Figure 16:
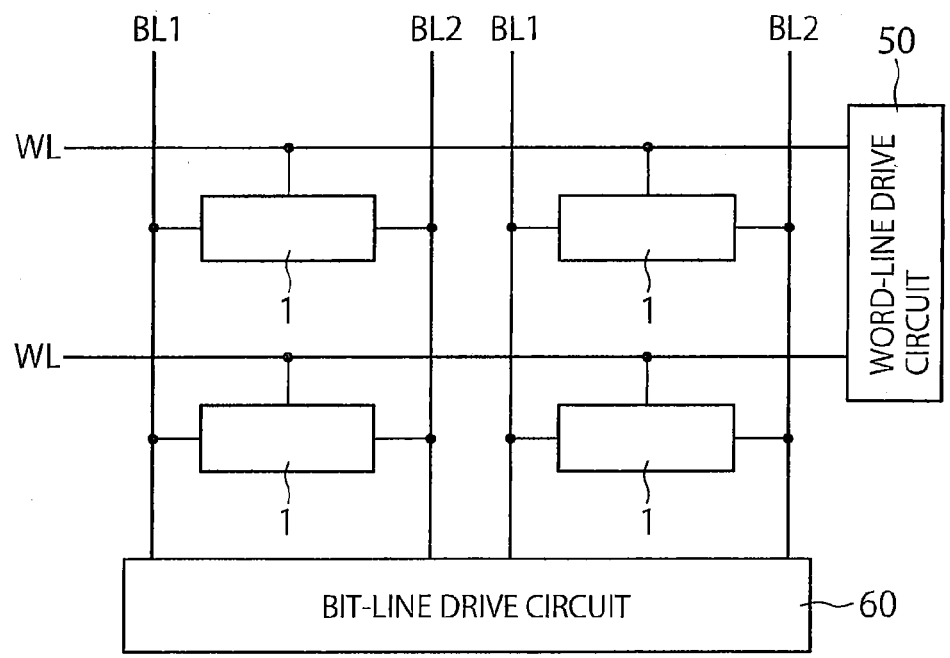
FIG. 16 is a circuit diagram showing a memory according to a fifth embodiment.

Referring now to FIG. 16, a memory according to a fifth embodiment is described. FIG. 16 is a circuit diagram of the memory of the fifth embodiment. The memory of the fifth embodiment has a structure in which spin transistors 1 according to one of the first through fourth embodiments are arranged as memory cells in a matrix fashion. The gate electrodes of the spin transistors 1 in the same row are connected to a single word line WL. One of the lower electrode 4 and the upper electrode 18 of each of the spin transistors 1 in the same column is connected to a bit line BL1, and the other one of the electrodes is connected to a bit line BL2.

When writing is to be performed, a single word line WL is selected by a word-line drive circuit 50, and the spin transistor 1 that has a gate electrode connected to the selected word line WL and is to be subjected to the writing is put into an on state. The bit line BL1 and the bit line BL2 that are connected to the spin transistor 1 to be subjected to the writing are selected by a bit-line drive circuit 60. A write current is then applied between the bit line BL1 and the bit line BL2. In this manner, the writing is performed on the spin transistor 1.

When reading is to be performed, a single word line WL is selected by the word-line drive circuit 50, and the spin transistor 1 that has a gate electrode connected to the selected word line WL and is to be subjected to the reading is put into an on state. The bit line BL1 and the bit line BL2 that are connected to the spin transistor 1 to be subjected to the reading is selected by the bit-line drive circuit 60. A read current is then applied between the bit line BL1 and the bit line BL2. In this manner, data is read from the spin transistor 1.

In the memory of the fifth embodiment, spin transistors that can increase the $I_D^P/I_D^{AP}$ ratio are used as storage elements. Accordingly, the $I_D^P/I_D^{AP}$ ratio can be increased.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A spin transistor comprising:
a first magnetic layer formed above a substrate and serving as one of a source and a drain;
a tunnel insulating film having a lower face being in contact with an upper face of the first magnetic layer, an upper face opposed to the lower face, and a side face different from the lower and upper faces, the tunnel insulating film serving as a channel;
a second magnetic layer being in contact with the upper face of the tunnel insulating film and serving as the other one of the source and the drain;
a gate electrode formed along the side face of the tunnel insulating film; and
a gate insulating film located between the gate electrode and the side face of the tunnel insulating film,
wherein a first energy difference between a Fermi level of the gate electrode and a conduction band level of the gate insulating film is larger than a second energy difference between a Fermi level of the first magnetic layer and a conduction band level of the tunnel insulating film.

2. The transistor according to claim 1, wherein the first magnetic layer is formed on either a semiconductor layer or a metal interconnect layer.

3. The transistor according to claim 1, wherein the tunnel insulating film is either an epitaxial film or an oriented film.

4. The transistor according to claim 1, wherein the tunnel insulating film is one of an epitaxial film and an oriented film, the one of the epitaxial film and the oriented film being made of one of magnesium oxide, aluminum oxide, magnesium aluminum oxide, lanthanum strontium oxide, cerium oxide, zirconium oxide, strontium oxide, and tantalum oxide.

5. The transistor according to claim 1, wherein the tunnel insulating film and the gate insulating film are made of the same material.

6. The transistor according to claim 1, wherein
the tunnel insulating film is made of aluminum oxide and the gate insulating film is made of magnesium oxide or silicon oxide.

7. The memory according to claim 1, wherein the first magnetic layer is a recording layer and the second magnetic layer is a magnetization fixed layer.

8. A memory comprising a spin transistor being used as a storage element, the spin transistor comprising:
a first magnetic layer formed above a substrate and serving as one of a source and a drain;
a tunnel insulating film having a lower face being in contact with an upper face of the first magnetic layer, an upper face opposed to the lower face, and a side face different from the lower and upper faces, the tunnel insulating film serving as a channel;
a second magnetic layer being in contact with the upper face of the tunnel insulating film and serving as the other one of the source and the drain;
a gate electrode formed along the side face of the tunnel insulating film; and
a gate insulating film located between the gate electrode and the side face of the tunnel insulating film,
wherein a first energy difference between a Fermi level of the gate electrode and a conduction band level of the gate insulating film is larger than a second energy difference between a Fermi level of the first magnetic layer and a conduction band level of the tunnel insulating film.

9. The memory according to claim 8, wherein the first magnetic layer is formed on either a semiconductor layer or a metal interconnect layer.

10. The memory according to claim 8, wherein the tunnel insulating film is either an epitaxial film or an oriented film.

11. The memory according to claim 8, wherein the tunnel insulating film is one of an epitaxial film and an oriented film, the one of the epitaxial film and the oriented film being made of one of magnesium oxide, aluminum oxide, magnesium aluminum oxide, lanthanum strontium oxide, cerium oxide, zirconium oxide, strontium oxide, and tantalum oxide.

12. The memory according to claim 8, wherein the tunnel insulating film and the gate insulating film are made of the same material.

13. The memory according to claim 8, further comprising: a first wiring electrically connected to the gate electrode; a second wiring electrically connected to the first magnetic layer; and a third wiring electrically connected to the second magnetic layer.

14. The memory according to claim 8, wherein
   the tunnel insulating film is made of aluminum oxide and
     the gate insulating film is made of magnesium oxide or silicon oxide.

15. The memory according to claim 8, wherein the first magnetic layer is a recording layer and the second magnetic layer is a magnetization fixed layer.

\* \* \* \* \*